(12) United States Patent
Schamberger et al.

(10) Patent No.: US 7,054,180 B2
(45) Date of Patent: May 30, 2006

(54) METHOD AND CIRCUIT FOR ADJUSTING A RESISTANCE IN AN INTEGRATED CIRCUIT

(75) Inventors: Florian Schamberger, München (DE); Jörg Peter, Eresing (DE)

(73) Assignee: Infineon Technologies AG, Munich (DE)

( * ) Notice: Subject to any disclaimer, the term of this patent is extended or adjusted under 35 U.S.C. 154(b) by 219 days.

(21) Appl. No.: 10/737,481

(22) Filed: Dec. 16, 2003

(65) Prior Publication Data
US 2005/0196909 A1   Sep. 8, 2005

(30) Foreign Application Priority Data
Dec. 23, 2002   (DE) ................ 102 60 818

(51) Int. Cl.
*G11C 17/00* (2006.01)
*G11C 7/00* (2006.01)

(52) U.S. Cl. ....................... 365/96; 365/225.7

(58) Field of Classification Search ............... 365/96, 365/225.7; 257/529
See application file for complete search history.

(56) References Cited

U.S. PATENT DOCUMENTS

| | | | | |
|---|---|---|---|---|
| 5,708,291 A * | 1/1998 | Bohr et al. | ................ | 257/529 |
| 5,969,404 A | 10/1999 | Bohr et al. | ................ | 257/529 |
| 6,323,534 B1 * | 11/2001 | Marr et al. | ................ | 257/529 |
| 6,436,738 B1 | 8/2002 | Yu | ................ | 438/132 |
| 6,642,601 B1 * | 11/2003 | Marshall et al. | ........... | 257/529 |
| 6,859,408 B1 * | 2/2005 | Porter et al. | ............. | 365/225.7 |
| 2005/0224910 A1 * | 10/2005 | Kuno et al. | ................ | 257/529 |

FOREIGN PATENT DOCUMENTS
DE           101 03 298        1/2001

OTHER PUBLICATIONS
German Examination Report for dated Oct. 9, 2003.

* cited by examiner

*Primary Examiner*—Anh Phung
(74) *Attorney, Agent, or Firm*—Patterson & Sheridan, L.L.P.

(57) ABSTRACT

A method for adjusting a resistance in an integrated circuit, the resistance having a first conductive area and a second conductive area between which a dielectric area is arranged, a programming current being conducted through the resistance, the programming current being selected so as to adjust a resistance value of the resistance which is selected from a resistance range and is dependent on the programming current.

24 Claims, 3 Drawing Sheets

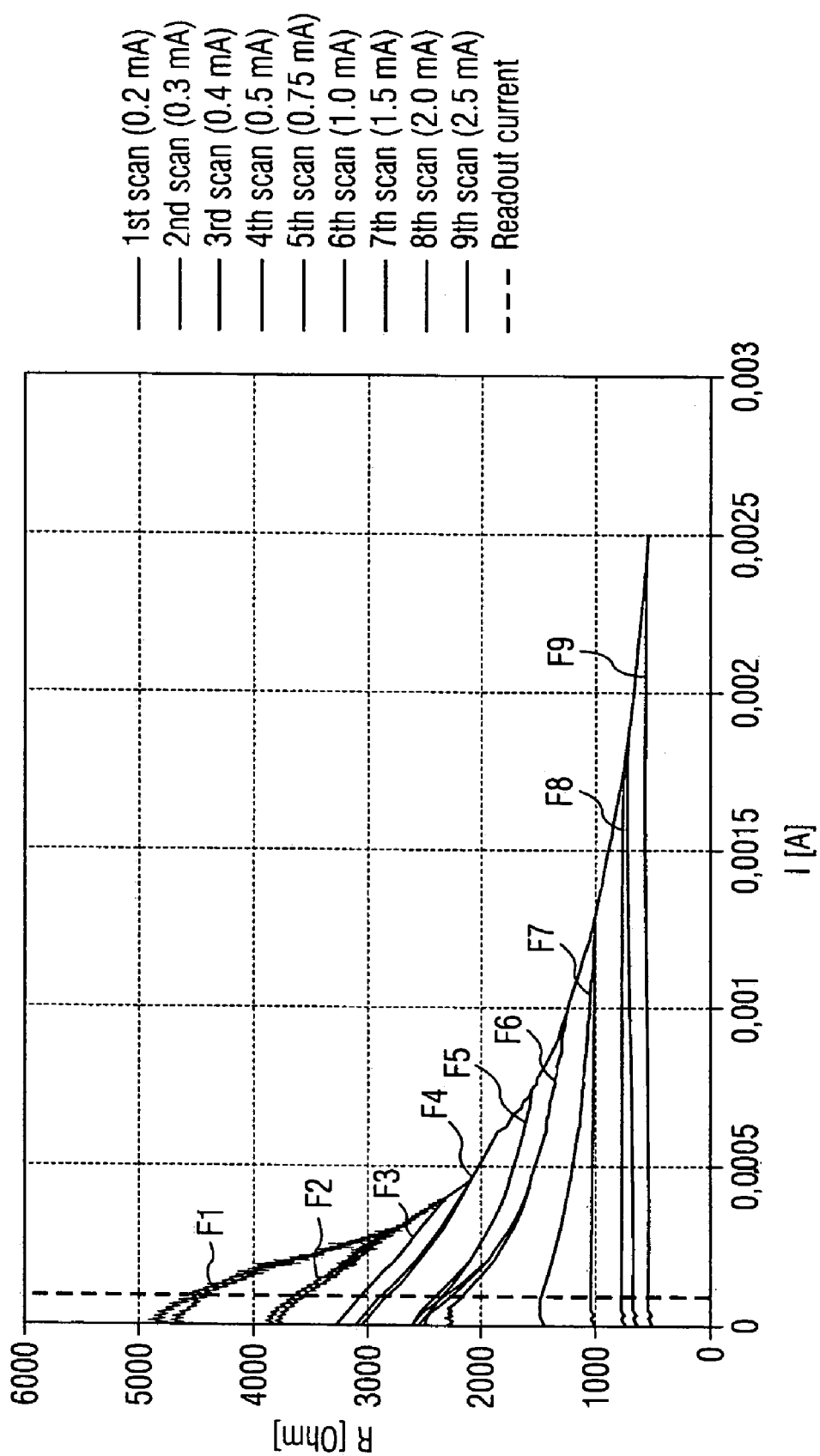

METHOD AND CIRCUIT FOR ADJUSTING A RESISTANCE IN AN INTEGRATED CIRCUIT

CROSS-REFERENCE TO RELATED APPLICATIONS

This application claims foreign priority benefits under 35 U.S.C. §119 to co-pending German patent application 102 60 818.0, filed Dec. 23, 2002. This related patent application is herein incorporated by reference in its entirety.

BACKGROUND OF THE INVENTION

1. Field of the Invention

The invention relates to a method for adjusting a resistance in an integrated circuit, particularly for adjusting the resistance value of a fuse component. The invention also relates to a circuit by means of which such a resistance can be adjusted.

2. Description of the Related Art

In integrated circuits, resistances are needed, the resistance values of which must be adjusted more or less accurately. The resistances are implemented in the integrated circuit, for example, by using channels with corresponding doping. This leads to a large-area fixed resistance which is hard to control.

It is also possible to use transistors as resistance elements but not completely switching through the transistors. This leads to a nonlinear resistance characteristic and to a relatively large area being required for this resistance.

In addition, high-resistance conductor tracks can be used which can be trimmed to a desired value by means of a laser. This is only possible as long as the surface of the integrated circuit is accessible, that is to say only in the case of unpackaged chips.

SUMMARY OF THE INVENTION

It is, therefore, the object of the present invention to provide a resistance component for integration in an integrated circuit, the resistance value of which can be adjusted in a simple and accurate manner and which requires only a small area.

According to a first aspect of the present invention, a method for adjusting a resistance in an integrated circuit is provided. The resistance exhibits a first conductive area and a second conductive area, between which a resistance area is arranged. Such a structure can be an antifuse structure or a migration fuse structure. A programming current is conducted through the resistance, the programming current being selected so as to adjust a resistance value, dependent on the programming current, of the resistance, which resistance value is selected from a resistance range.

It has hitherto been normal practice to use an antifuse structure or a migration fuse structure for adjusting digital adjustment values in the integrated circuit. For this purpose, the fuse structures are connected to evaluating circuits which supply a digital value depending on the state of the fuse structure.

An antifuse structure is initially not conductive. To program the antifuse structure, a programming current is conducted or not conducted through the antifuse structure. This results in two states of the antifuse structure: a first state in which the antifuse structure does not conduct and a second state in which the antifuse structure essentially has a low resistance. The two states correspond to the switching states of the subsequent switch.

A migration fuse structure is initially at first conductive. To program the migration fuse structure, a programming current is conducted or is not conducted through the migration fuse structure. In a first state, when no programming current has been applied, the migration fuse structure is then conductive and in a second state, when a programming current has been applied, the migration fuse structure essentially has a high resistance. The two states correspond to the switching states of the subsequent switch.

The invention is based on the observation that different resistance values of the fuse structure can be adjusted depending on the programming current applied or, respectively, the duration of the programming current, i.e. the resistance values are freely selectable in a range of good conductance up to a range of insulation.

Due to the fact that the programming current determines the resistance value assumed by the fuse structure, a resistance value can be arbitrarily selected for the fuse structure from a range of resistances. It is possible to use both the antifuse structure and the migration fuse structure as a value-continuous resistance element, and not only as an element for adjusting discrete adjustment values in an integrated circuit.

In the range of adjustable resistances in the antifuse structure, there is a range in which the adjustable resistance is essentially independent of an operating current. The operating current is the current which is impressed into the resistance by a circuit in which the resistance is used. In this manner, a constant resistance can be ensured even when the currents of the resistance changes.

It is preferably provided that the programming current is applied to an external connection of the integrated circuit. This has the advantage that internal generation of a programming current in the integrated circuit is not required and thus a programming circuit necessary for this can be saved in the integrated circuit.

It can also be provided that the programming current is generated internally in the integrated circuit so that the adjustment of the resistance values is performed without external help, for example during the first start-up.

According to a further aspect of the present invention, a circuit for adjusting a resistance in an integrated circuit is provided. As described above, the resistance is constructed as a fuse structure. Furthermore, a programming circuit is provided in order to conduct a defined programming current through the resistance in order to adjust a resistance value selected from a range of resistances.

The programming circuit is used for providing a programming current which depends on the resistance to be adjusted.

The fuse structure is preferably constructed as an antifuse structure which has a dielectric area as resistance area. For this purpose, it can be provided that the programming circuit has a current source in order to conduct through the resistance a programming current which increases with time. When the predetermined resistance value is reached, the current source can be switched off in order to retain the resistance value set. During the increase in programming current, the changing resistance value set in each case is continuously measured and it is determined, whether the set resistance value corresponds to the desired resistance value to be set. If the desired resistance value has been reached, the resistance value which has just been reached can be retained by switching off the current source. This makes it possible to implement a programming circuit which is as simple as possible and by means of which a resistance formed from an antifuse structure can be adjusted.

Preferably, a measuring circuit is provided which detects when the predetermined resistance has been reached and switches off the current source.

It can also be provided that the resistance range has a conductor area which is used as a migration area. The programming circuit selects the defined programming current, and applies it for a particular period of time, so that a defined decrease in a cross section of the conductor area is achieved by electromigration. In this manner, the resistance of the resistance area can be increased by decreasing the cross section. The amount of resistance depends on the programming current applied and on the period of time for which the programming current is applied.

The programming circuit can preferably have a current source in order to conduct the programming current, at which electromigration occurs in the resistance area, through the resistance, wherein the current source can be switched off when the predetermined resistance value is reached, in order to retain the set resistance value. This defines the period of time in which the programming current is applied.

According to a further aspect of the present invention, a method for using an antifuse component as resistance element with a resistance which can be freely adjustable within a resistance range by means of a programming current is provided. This makes it possible to use antifuse components not only as permanent adjustment memories for adjustment values but also for the resistance elements which are used in an integrated circuit.

BRIEF DESCRIPTION OF THE DRAWINGS

In the text which follows, preferred embodiments of the invention are explained in greater detail by means of the attached drawings, in which:

FIG. 2 shows the function of the resistance of the antifuse component in dependence on the current conducted through it and the parameter of the programming current;

DETAILED DESCRIPTION OF THE PREFERRED EMBODIMENT

Figure 1:
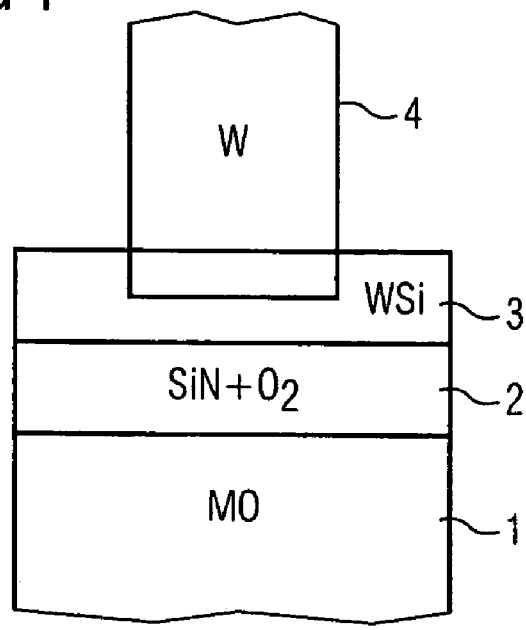
FIG. 1 shows a possible structure of an antifuse component.

FIG. 1 shows an antifuse structure. It has a first conductive layer 1 which is preferably built from a metalizing layer. Above this, a dielectric layer 2 is applied which has, e.g., a dielectric constant ∈R=5.5. Naturally, dielectric layers having other dielectric constants can also be used. The dielectric layer 2 can have silicon nitride in which oxygen molecules are implanted.

Above this, a second conductive layer 3 is deposited which is contacted via a conductor connection 4. The second conductive layer 3 preferably has tungsten silicate but can also have other materials which are conductive. The conductor connection 4 is preferably constructed of tungsten, but other electrically conductive materials are also suitable for it, such as, e.g., aluminum, copper etc.

After such an antifuse structure has been produced, the antifuse structure is initially nonconductive since a noncon-ductive dielectric is arranged between the first conductive layer 1 and the second conductive layer 3. If a programming current is impressed into the antifuse structure, the breakdown voltage above the dielectric layer 2 is exceeded and a breakdown channel forms which changes the dielectric layer 2 in such a manner that it retains a state in which it becomes conductive. The size of the breakdown channel is determined by the intensity of the programming current. The resistance which is adjusted above the antifuse structure is dependent on the size of the breakdown channel.

FIG. 2 shows a functional diagram which represents the relationship between the resistance and the current conducted. The programming current is the parameter for the several functional curves. Function F1 indicates the variation of resistance of the antifuse structure with previous programming of the antifuse structure with a programming current of 0.2 mA. In a range between 0.2 mA and 0.3 mA, a continuously decreasing resistance can be seen, a programming current increasing in this area causing a decrease in the resistance.

The second curve F2 shows the resistance curve of the antifuse structure with currents between 0.0 mA to 0.4 mA with previous programming with 0.3 mA and it can be seen that the variation of the resistance is greatly dependent on the current. In the range between 0.3 mA and 0.4 mA, a further drop in the resistance curve can be seen. In this area, the antifuse structure is programmed, i.e., the breakdown channel in the antifuse structure is widened or new breakdown channels are created so that the electrical resistance is reduced.

The third function F3 then shows the resistance curve with a preceding programming current of 0.4 mA. In the range between 0.4 mA and 0.5 mA, a linear variation of the resistance with respect to the current I can be seen again in the third function F3. The monotonically decreasing variation shows here, too, that the antifuse structure has been programmed in this area, i.e., new breakdown channels have been formed. Thus, the greatest current in each case applied to the antifuse structure in each case determines the resistance curve in a range from 0 mA up to the value of the greatest current hitherto applied.

In the diagram according to FIG. 2, nine functions are shown for nine different programming currents and it can be seen that the greater the programming current was, the more constant is the variation of the resistance in the range between 0 mA and the maximum programming current applied in dependence on the operating current applied. In particular in the range between 500 and 1000 $\Omega$ and with programming currents between 1.5 mA and 2.5 mA, an almost constant variation of the resistance with respect to the operating current applied can be seen. At the same time, a relatively flat variation of the decrease in resistance with respect to the programming voltage applied can be seen. This makes it possible to adjust the resistance of the antifuse structure very accurately with the aid of the programming current.

When the antifuse resistance is used in a later circuit, it is only necessary to pay attention to the fact that the normal operating current of the integrated circuit does not exceed the programming current since otherwise the resistance of the antifuse structure would be changed. In the diagram according to FIG. 2, the operating current, or readout current, is identified by the vertical dashed line at 0.2 mA. It is particularly in cases in which the operating current through the resistance fluctuates, e.g. in amplifier circuits, that it makes sense to design the antifuse structure in such a manner that relatively high programming currents can be used in order to achieve a linear variation of the resistance in the area of the operating current.

Figure 3A:
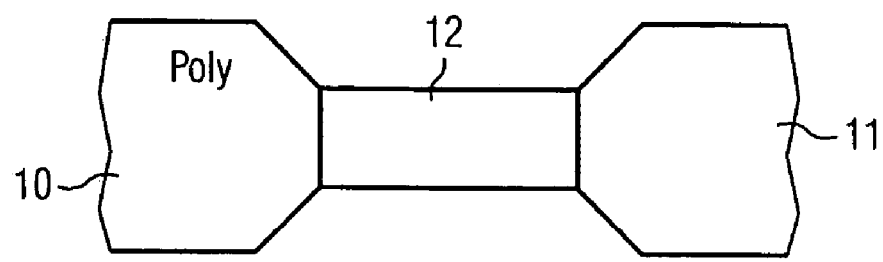
FIGS. 3a, 3b show a migration fuse resistance.

FIG. 3a shows a migration fuse structure with a third conductive layer 10 and a fourth conductive layer 11. Between the third and the fourth conductive layer 10, 11, a resistance area 12 is arranged which is conductive and which has a smaller cross section than the third and fourth conductive layer 10, 11. When a programming current is applied, the current density within the resistance area 12 is thus increased compared with the third and the fourth conductive area.

Figure 3B:
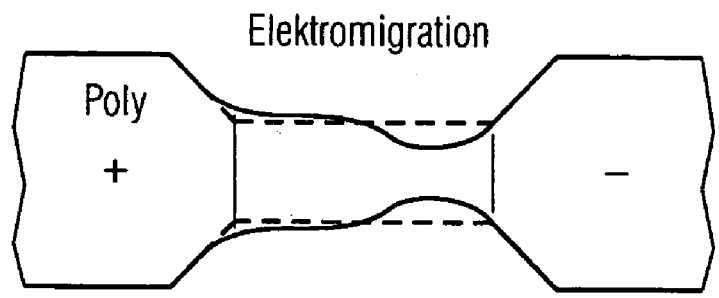

During the electromigration, a material transport of the conductor material takes place against the direction of the current at high current densities which are material-dependent. In FIG. 3b, the change in the migration fuse structure according to FIG. 3a after a programming current has been applied for a particular period is shown. It can be seen that the cross section of the resistance area 12 is reduced in the vicinity of the lower potential and the cross section of the resistance area 12 is increased in the vicinity of the higher potential. The reduction in cross section causes an increase in resistance, the cross section of the resistance area 12 which has been achieved depending on the intensity of the electromigration effect. The intensity of the electromigration can be determined essentially by the magnitude of the programming current and the duration for which the programming current has been applied over the resistance area. The resistance of the migration fuse structure can thus be adjusted almost arbitrarily.

Figure 4:
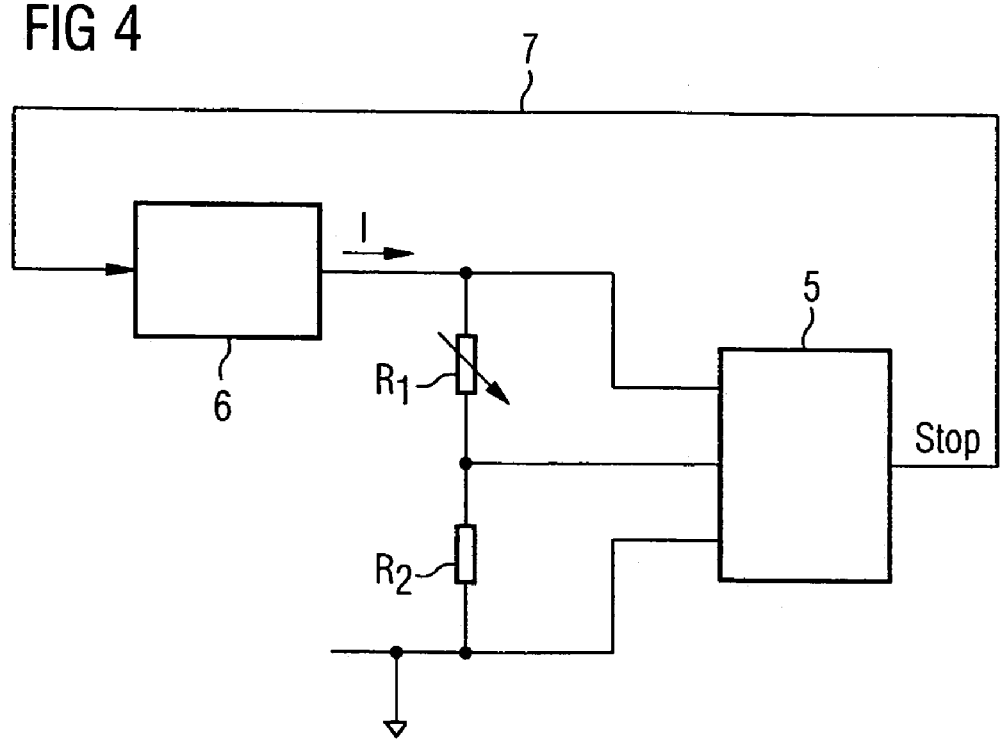
FIG. 4 shows a programming circuit for an antifuse resistance according to an embodiment of the present invention.

FIG. 4 shows a circuit for programming an antifuse resistance R1. The antifuse resistance R1 is connected in series with a second resistance R2. The series circuit of the two resistances is connected to a comparator circuit 5 in such a manner that the voltages dropped across the antifuse resistance R1 and across the second resistance R2 are compared with one another. A current I which is generated in a current source 6 is conducted through the series circuit of the resistances R1, R2.

It is the aim of the circuit to adjust the antifuse resistance R1 with the aid of the resistance value of the second resistance R2. For this purpose, the current source 6 outputs a slowly increasing current I which causes programming of the antifuse resistance R1 and, at the same time, voltage drops across the antifuse resistance R1 and the second resistance R2. The voltage dropped across the antifuse resistance R1 is determined in accordance with the resistance value of the antifuse resistance R1 which depends on the programming current I.

If the same voltage is dropped across the two resistances R1, R2, the comparator circuit 5 generates a stop signal which is applied to the current source 6 via a signal line 7. In the current source 6, the current is stopped from increasing as a consequence of the stop signal. This can be done by switching off the current source as a whole or by keeping the impressed current at the level reached. As soon as the stop signal causes the current I to stop increasing further, the resistance value of the antifuse resistance R1 is equal to the resistance value of the second resistance R2 at the current value I reached.

Depending on the magnitude of the programming current, the resistance value of the antifuse resistance R1 is essentially constant with the current applied (see FIG. 2) so that this programmed antifuse resistance R1 can be operated as fixed resistance in an integrated circuit.

To program the antifuse resistance R1, it can be provided that the remaining programming circuit with the second resistance of the comparator circuit 5 and the current source 6 are provided outside the integrated circuit and only the antifuse resistance R1 to be programmed can be contacted via two connections. This makes it possible to save area in the integrated circuit and, at the same time, to perform a very accurate adjustment of the antifuse resistance R1 since the second resistance R2 can be predetermined very accurately, for example by using a shunt resistance.

Naturally, it can also be provided that the comparator circuit 5 and the current source 6 are arranged internally so that only a calibration resistance in the form of the second resistance R2 has to be applied to two external connections of the integrated circuit.

Figure 5:
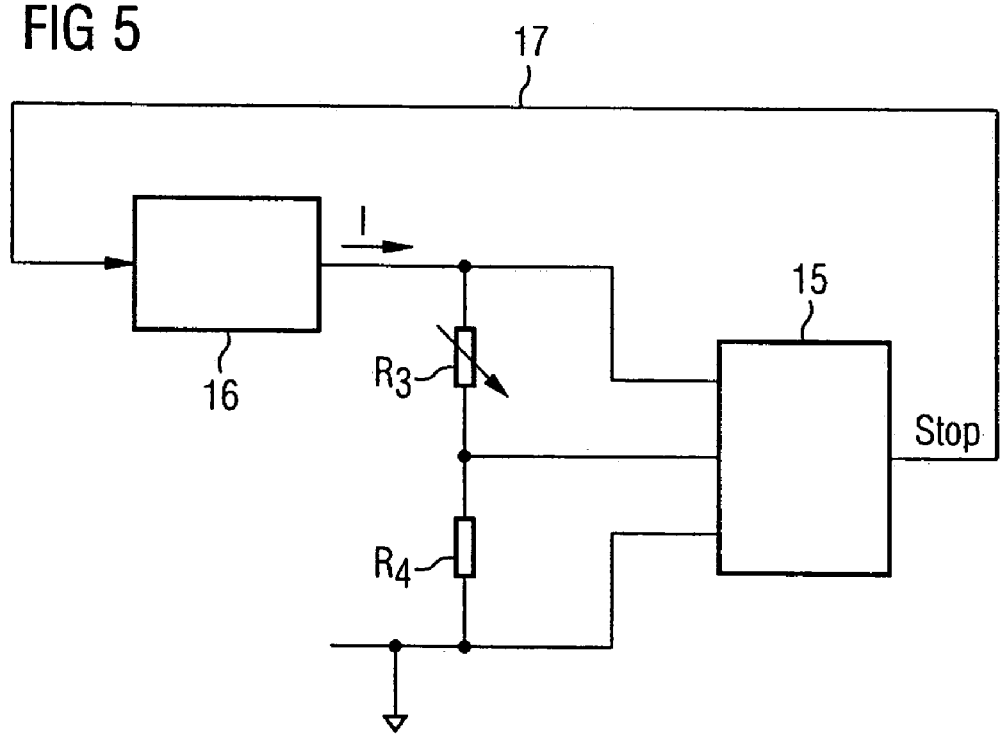
FIG. 5 shows a programming circuit for a migration fuse resistance according to a further embodiment of the present invention.

To adjust a migration fuse structure to a desired resistance value, a similar circuit to the circuit according to FIG. 4 can essentially be used. Such a circuit is shown in FIG. 5. The migration fuse resistance R3 is connected in series with a third resistance R4. The series circuit of the two resistances R3, R4 is connected to a comparator circuit 15 in such a manner that the voltages dropped across the migration fuse resistance R3 and across the third resistance R4 are compared with one another. A current I which is generated in a second current source 16 is conducted through the series circuit, its migration fuse resistance R3 and a third resistance R4.

Similar to the circuit according to FIG. 4, it is the aim of the circuit according to FIG. 5 to adjust the migration fuse resistance R3 to the resistance value of the third resistance R4. For this purpose, the second current source 16 outputs a current I which causes an electromigration effect in the migration fuse resistance R3. At the same time, the current I causes voltage drops across the migration fuse resistance R3 and the third resistance R4. The voltage dropped across the migration fuse resistance R3 is determined in accordance with the resistance value of the migration fuse resistance R3 which depends on the programming current I from a second current source 16.

If the same voltage is dropped across the two resistances R3, R4, the second comparator circuit 15 generates a stop signal which is applied via a second signal line 17 to the second current source 16, where the programming current is switched off as a consequence of the stop signal. In this manner, the resistance value just reached in the migration fuse resistance is not changed any further and is thus retained.

In contrast to the antifuse resistance, migration fuse resistances are essentially constant with the current applied so that there is no need to select the resistance range in order to achieve as constant as possible a resistance variation with the operating current.

The advantage of using an antifuse structure as adjustable resistance consists in that, on the one hand, the resistance can be adjusted very accurately and, on the other hand, that an antifuse structure has a very small area requirement compared with high-resistance tracks which are usually integrated into an integrated circuit. In addition, it is possible to program the antifuse resistance even after the integrated circuit has been packaged.

What is claimed is:

1. A method for programming fuses, comprising:
   providing a fuse comprising a first conductive area, a second conductive area and a resistance area disposed between the first and second conductive areas;
   applying a programming current to the fuse for a period of time in order to create a breakdown channel within the resistance area; and
   terminating the programming current upon achieving a desired resistance value of the fuse.

2. The method of claim 1, further comprising, prior to applying the programming current, selecting the programming current on the basis of an expected operating current to be applied to the fuse during its use within an integrated circuit, wherein an expected peak value of the expected operating current is less than a peak value of the programming current.

3. The method of claim 1, further comprising, prior to applying the programming current, selecting the desired resistance value for the fuse from a range of program-current-dependent resistance values.

4. The method of claim 1, further comprising increasing the programming current over the period of time.

5. The method of claim 1, wherein the fuse is an antifuse.

6. The method of claim 1, wherein the fuse is a migration fuse.

7. The method of claim 1, wherein the fuse is disposed in an integrated circuit and the programming current is applied to an external connection of the integrated circuit.

8. The method of claim 1, wherein the fuse is disposed in an integrated circuit and the programming current is generated internally to the integrated circuit.

9. A method for programming fuses, comprising:
providing a fuse comprising a first conductive area, a second conductive area and a resistance area disposed between the first and second conductive areas;
applying a programming current to the fuse for a period of time in order to create a breakdown channel within the resistance area;
measuring a resistance value of the fuse while applying the programming current, wherein the resistance value changes with continued application of the programming current; and
terminating the programming current upon achieving a desired resistance value of the fuse.

10. The method of claim 9, further comprising, prior to applying the programming current, selecting the programming current on the basis of an expected operating current to be applied to the fuse during its use within an integrated circuit, wherein an expected peak value of the expected operating current is less than a peak value of the programming current.

11. The method of claim 9, further comprising, prior to applying the programming current, selecting the desired resistance value for the fuse from a range of program-current-dependent resistance values.

12. The method of claim 9, further comprising increasing the programming current over the period of time.

13. The method of claim 9, wherein amperage of the programming current is held constant over the period of time and produces an increasing resistance value.

14. A fuse programming apparatus, comprising:
a fuse to be programmed and having a variable resistance value responsive to a programming current;
a resistance element having a resistance value desired to be programmed into the fuse;
a current source electrically connected to the fuse and the resistance element and configured to produce the programming current; and
a comparator electrically connected to the fuse and the resistance element; wherein the comparator is configured to measure a voltage drop across the fuse and the resistance element during application of the programming current from the current source, and is further configured to cause the current source to terminate application of the programming current when a voltage drop across the fuse is substantially equal to a voltage drop across the resistance element.

15. The apparatus of claim 14, wherein the fuse is an antifuse.

16. The apparatus of claim 14, wherein the fuse is a migration fuse.

17. The apparatus of claim 14, wherein the current source is configured to increase the programming current during a period of time in which the fuse is being programmed.

18. A circuit, comprising:
a fuse comprising a first conductive area, a second conductive area and a resistance area disposed between the first and second conductive areas; and
a programming circuit configured to conduct a controlled programming current through the resistance area of the fuse in order to adjust a resistance value of the fuse, the resistance value being selected from a range of resistance values.

19. The circuit of claim 18, wherein the resistance area comprises a migration area and wherein the programming circuit selects and applies the programming current for a particular period of time so as to achieve a defined decrease in a cross-sectional area of the resistance area by electromigration.

20. The circuit of claim 18, wherein the programming circuit is configured to detect that the selected resistance value has been achieved.

21. The circuit of claim 18, wherein the programming circuit is configured to terminate the programming current upon determining that the selected resistance value has been achieved.

22. The circuit of claim 18, wherein the programming circuit is configured to increase the programming current during a period of time in which the fuse is being programmed with the selected resistance value.

23. The circuit of claim 22, wherein the programming circuit is configured to terminate the programming current upon determining that the selected resistance value has been achieved.

24. A method for adjusting a resistance in an integrated circuit, comprising:
providing a fuse comprising a first conductive area, a second conductive area and a resistance area between the first and second conductive areas;
selecting a resistance value of the resistance area from a range of resistance values, each value being dependent on a respective programming current;
selecting a programming current on the basis of the selected resistance value; and
applying the programming current to the resistance area to cause a change in a resistance of the resistance area until the selected resistance value is achieved.

* * * * *